(12) United States Patent
Kim et al.

(10) Patent No.: US 10,504,902 B2
(45) Date of Patent: Dec. 10, 2019

(54) DATA STORAGE DEVICES AND METHODS OF MANUFACTURING THE SAME

(71) Applicant: Samsung Electronics Co., Ltd., Suwon-si, Gyeonggi-do (KR)

(72) Inventors: Hong Hyun Kim, Seoul (KR); Seung Pil Ko, Hwaseong-si (KR); Hyunchul Shin, Seoul (KR); Kilho Lee, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 15/959,366

(22) Filed: Apr. 23, 2018

(65) Prior Publication Data

US 2019/0088656 A1  Mar. 21, 2019

(30) Foreign Application Priority Data

Sep. 19, 2017  (KR) .................. 10-2017-0120598

(51) Int. Cl.
| | |
|---|---|
| *H01L 27/105* | (2006.01) |
| *H01L 43/02* | (2006.01) |
| *G11C 11/16* | (2006.01) |
| *H01L 43/08* | (2006.01) |
| *H01L 43/12* | (2006.01) |
| *H01L 27/22* | (2006.01) |

(52) U.S. Cl.
CPC ........ *H01L 27/1052* (2013.01); *G11C 11/161* (2013.01); *H01L 27/228* (2013.01); *H01L 43/02* (2013.01); *H01L 43/08* (2013.01); *H01L 43/12* (2013.01); *G11C 11/165* (2013.01)

(58) Field of Classification Search
CPC ... H01L 27/1052; H01L 43/08; H01L 27/228; H01L 43/12; H01L 43/02; G11C 11/161; G11C 11/165
See application file for complete search history.

(56) References Cited

U.S. PATENT DOCUMENTS

| | | |
|---|---|---|
| 6,335,285 B1 | 1/2002 | Chun et al. |
| 7,307,002 B2 | 12/2007 | Kim et al. |
| 8,865,481 B2 | 10/2014 | Li et al. |

(Continued)

FOREIGN PATENT DOCUMENTS

| | | |
|---|---|---|
| KR | 1020050041193 | 5/2005 |
| KR | 100668836 | 1/2007 |

*Primary Examiner* — Nadine G Norton
*Assistant Examiner* — Mahmoud Dahimene
(74) *Attorney, Agent, or Firm* — Myers Bigel, P.A.

(57) ABSTRACT

Disclosed are data storage devices and methods of manufacturing the same. The methods may include providing a substrate including a cell region and a peripheral circuit region, forming a data storage layer on the cell region and the peripheral circuit region of the substrate, selectively forming a mask layer on a portion of the data storage layer that is formed on the peripheral circuit region, forming a top electrode layer on the data storage layer and the mask layer, patterning the top electrode layer to form a plurality of top electrodes on the cell region, and patterning the data storage layer using the plurality of top electrodes as an etch mask to form a plurality of data storage parts on the cell region. While patterning the top electrode layer, the mask layer on the peripheral circuit region may serve as an etch stop layer.

20 Claims, 13 Drawing Sheets

(56) References Cited

U.S. PATENT DOCUMENTS

| | | | |
|---|---|---|---|
| 8,895,393 B2* | 11/2014 | Sim | H01L 27/11526 257/E21.21 |
| 9,543,357 B2 | 1/2017 | Ko et al. | |
| 2008/0242084 A1 | 10/2008 | Kim et al. | |
| 2012/0070944 A1 | 3/2012 | Kim et al. | |
| 2017/0069684 A1 | 3/2017 | Suh et al. | |

* cited by examiner

DATA STORAGE DEVICES AND METHODS OF MANUFACTURING THE SAME

CROSS-REFERENCE TO RELATED APPLICATION

This U.S. non-provisional patent application claims priority under 35 U.S.C. § 119 to Korean Patent Application No. 10-2017-0120598 filed on Sep. 19, 2017, the disclosure of which is hereby incorporated by reference in its entirety.

BACKGROUND

Inventive concepts generally relate to the field of electronics and, more particularly, to a data storage device and a method of manufacturing the same.

Semiconductor devices are beneficial in the electronics industry because of their small size, multi-functionality, and/or low fabrication cost. Data storage devices among semiconductor devices can store logic data. Data storage devices have become increasingly integrated with the development of the electronics industry. As a result, line widths of components included in data storage devices continue to decrease.

Additionally, high reliability has been demanded with the high integration of data storage devices. However, the high integration may deteriorate the reliability of the data storage devices. Therefore, various research has been conducted for enhancing the reliability of the data storage devices.

SUMMARY

Some embodiments of the present inventive concepts provide a data storage device having reduced process defects and a method of manufacturing the same.

Some embodiments of the present inventive concepts provide a data storage device having excellent reliability and a method of manufacturing the same.

According to some embodiments of the present inventive concepts, methods of manufacturing a data storage device may include providing a substrate including a cell region and a peripheral circuit region, forming a data storage layer on the cell region and the peripheral circuit region of the substrate, selectively forming a mask layer on a portion of the data storage layer that is formed on the peripheral circuit region, forming a top electrode layer on the data storage layer and the mask layer, patterning the top electrode layer to form a plurality of top electrodes on the cell region, and patterning the data storage layer using the plurality of top electrodes as an etch mask to form a plurality of data storage parts on the cell region. While patterning the top electrode layer, the mask layer on the peripheral circuit region may serve as an etch stop layer.

According to some embodiments of the present inventive concepts, methods of manufacturing a data storage device may include providing a substrate including a first region and a second region, forming a first interlayer dielectric layer on the first region and the second region of the substrate, forming a data storage layer on the first interlayer dielectric layer, selectively forming a mask layer on a portion of the data storage layer that is formed on the second region, forming a top electrode layer on the data storage layer and the mask layer, patterning the top electrode layer to form a plurality of top electrodes on the first region, and patterning the data storage layer using the plurality of top electrodes as an etch mask to form a plurality of data storage parts on the first region. During patterning the data storage layer, an upper portion of the first interlayer dielectric layer may be etched such that a first portion of the first interlayer dielectric layer that may be formed on the first region has a top surface at a different level from that of a top surface of a second portion of the first interlayer dielectric layer that is formed on the second region.

According to some embodiments of the present inventive concepts, data storage devices may include a substrate including a cell region and a peripheral circuit region, a memory transistor on the cell region and a peripheral transistor on the peripheral circuit region, an interlayer dielectric layer on the memory transistor and the peripheral transistor, a cell contact plug extending through the interlayer dielectric layer and electrically connected to the memory transistor, and a data storage structure on the interlayer dielectric layer and connected to the cell contact plug. The interlayer dielectric layer may include a first top surface on the cell region, a second top surface on the peripheral circuit region, and a sidewall connecting the first and second top surfaces to each other between the cell region and the peripheral circuit region. The sidewall may have an angle with respect to a top surface of the substrate of about 35 degrees to about 90 degrees.

According to some embodiments of the present inventive concepts, methods of manufacturing a data storage device may include forming a data storage layer extending on a first region and a second region of a substrate, forming a mask layer on a first portion of the data storage layer that is formed on the second region of the substrate, forming a top electrode layer on the data storage layer and the mask layer, forming a plurality of mask patterns on the top electrode layer on the first region of the substrate, forming a plurality of top electrodes on the first region by etching the top electrode layer using the plurality of mask patterns as an etch mask until a second portion of the data storage layer that is formed on the first region and the mask layer that is formed on the second region are exposed, and forming a plurality of data storage elements on the first region by etching the data storage layer using the plurality of top electrodes as an etch mask.

DETAILED DESCRIPTION

As used herein the term "and/or" includes any and all combinations of one or more of the associated listed items. Like reference numbers refer to like elements throughout.

Figure 1:
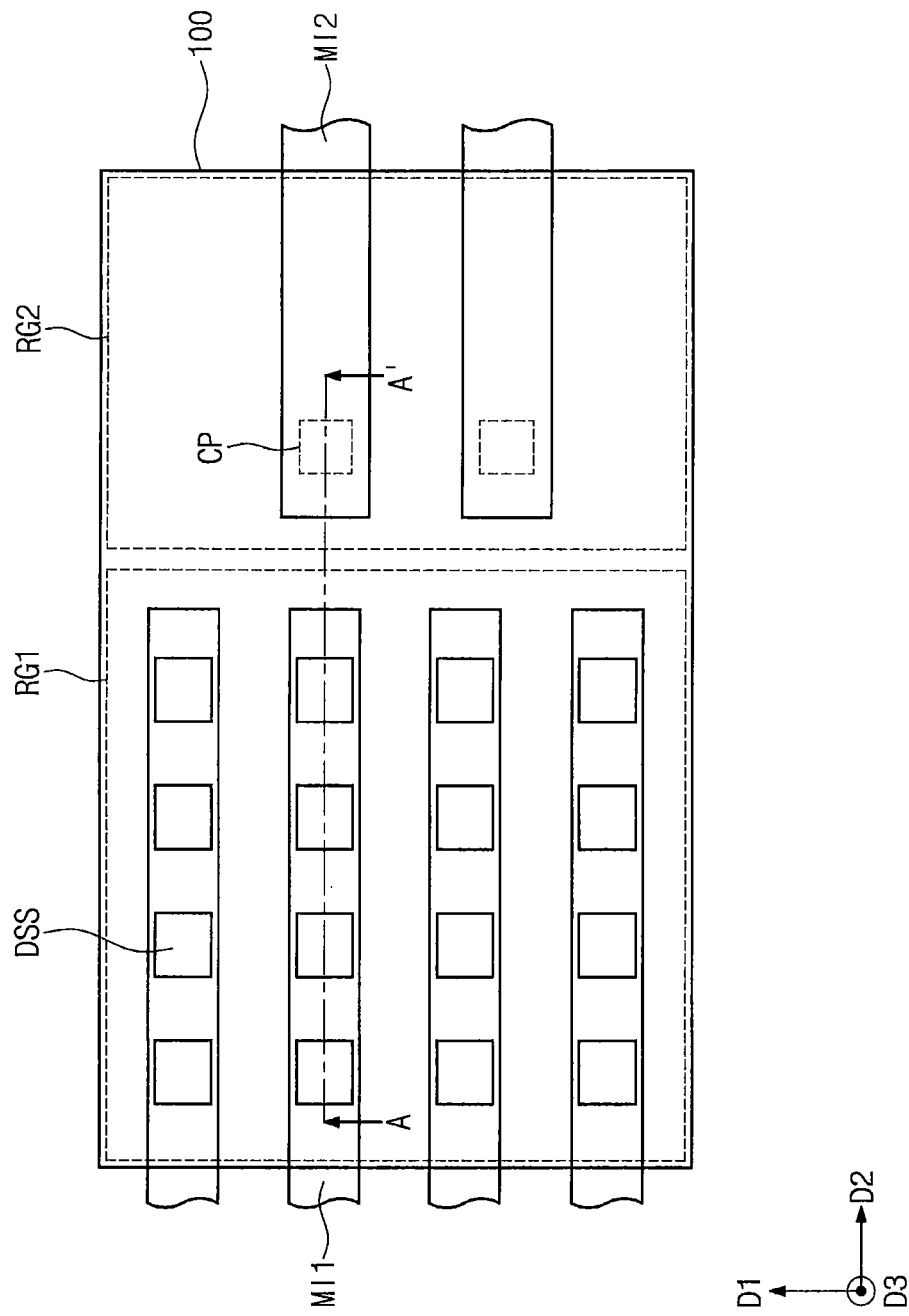
FIG. 1 illustrates a plan view showing a data storage device according to some embodiments of the present inventive concepts.
Figure 2:
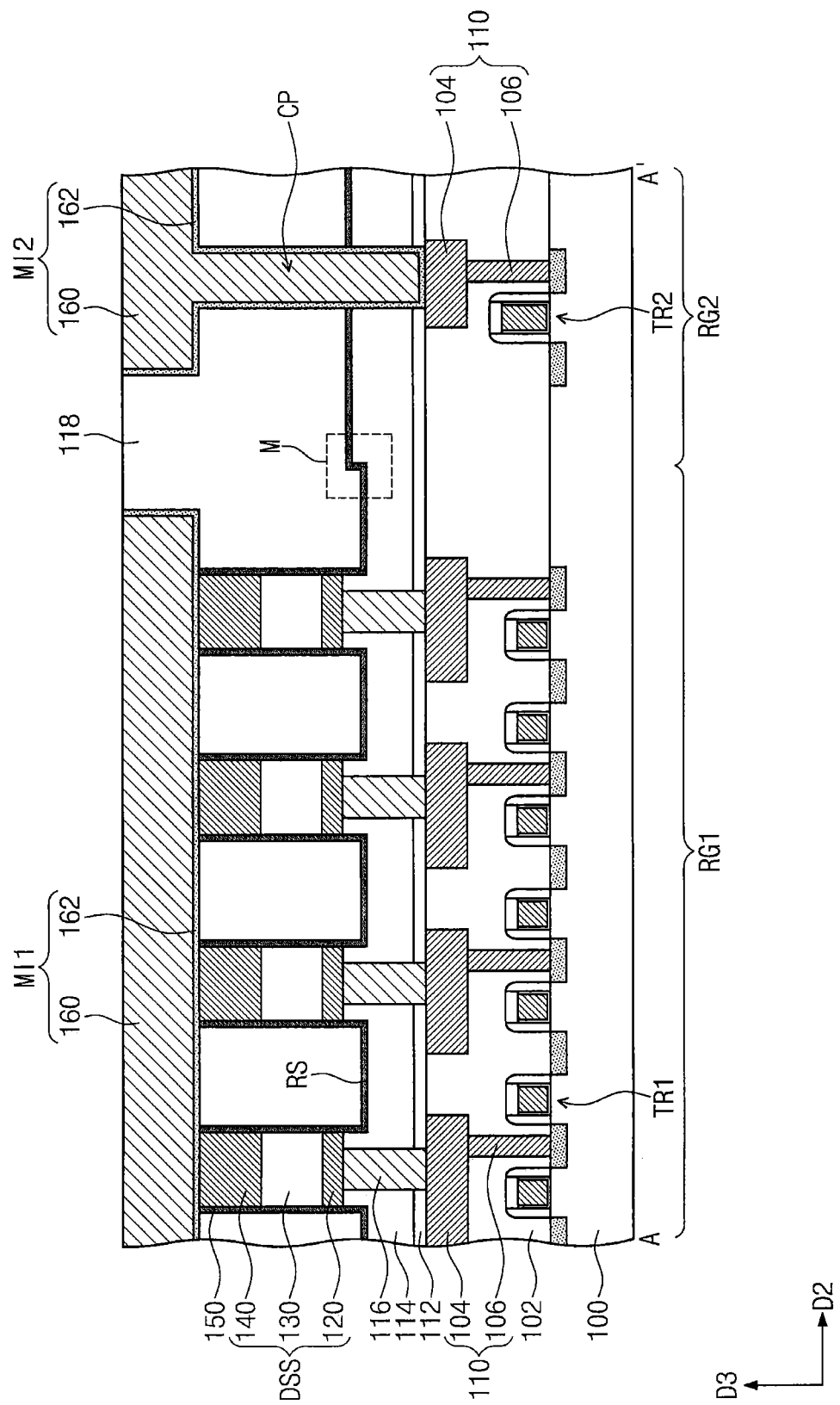
FIG. 2 illustrates a cross-sectional view taken along the line A-A' of FIG. 1.
Figure 3:
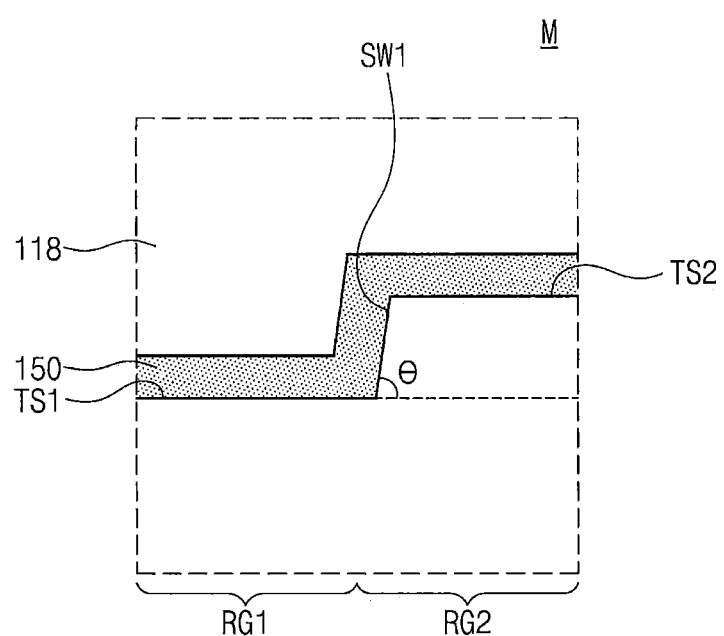
FIG. 3 illustrates an enlarged cross-sectional view showing section M of FIG. 2.
Figure 4A:
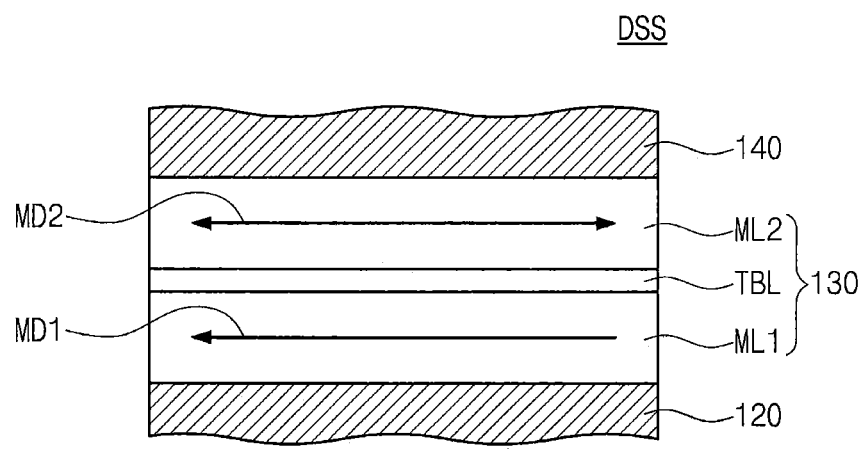
FIG. 4A illustrates a cross-sectional view showing a data storage structure according to some embodiments of the present inventive concepts.
Figure 4B:
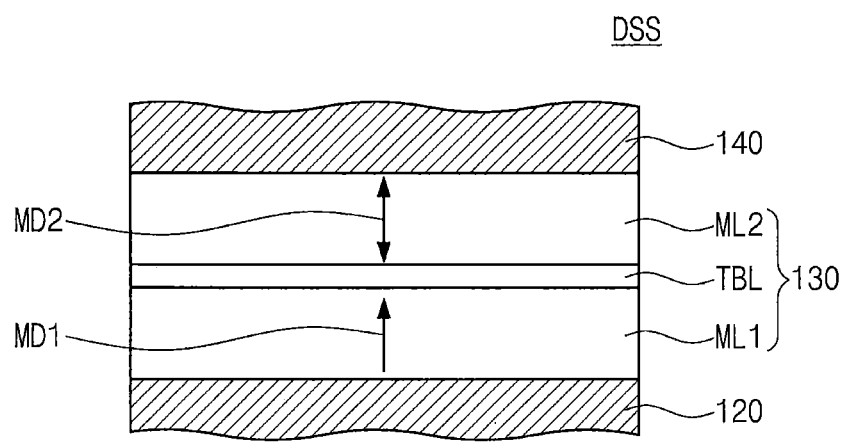
FIG. 4B illustrates a cross-sectional view showing a data storage structure according to some embodiments of the present inventive concepts.
Figure 5:
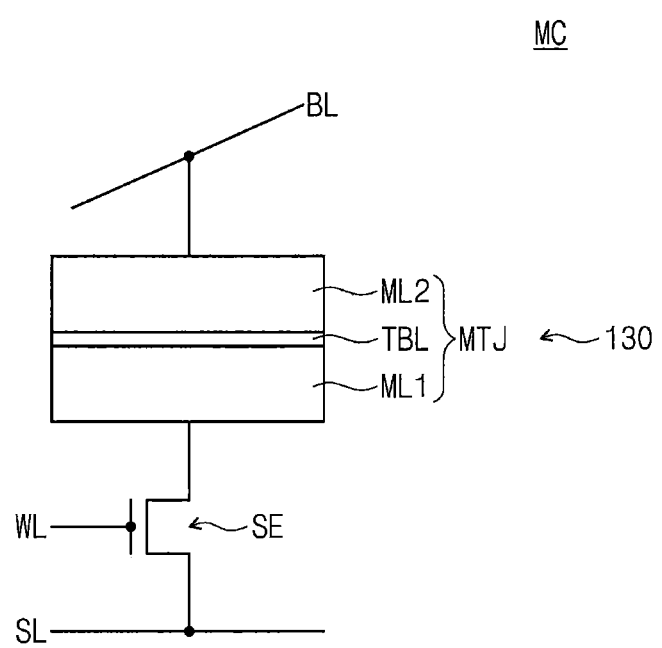
FIG. 5 illustrates a schematic diagram showing a unit memory cell of a data storage device according to some embodiments of the present inventive concepts.

FIG. 1 illustrates a plan view of a data storage device according to some embodiments of the present inventive concepts. FIG. 2 illustrates a cross-sectional view taken along the line A-A' of FIG. 1. FIG. 3 illustrates an enlarged cross-sectional view of the section M of FIG. 2. FIG. 4A illustrates a cross-sectional view of a data storage structure according to some embodiments of the present inventive concepts. FIG. 4B illustrates a cross-sectional view of a data storage structure according to some embodiments of the present inventive concepts. FIG. 5 illustrates a schematic diagram of a unit memory cell of a data storage device according to some embodiments of the present inventive concepts.

Referring to FIGS. 1 to 3, a substrate 100 may be provided to include a first region RG1 and a second region RG2. The first region RG1 may be a cell region where memory cells are provided, and the second region RG2 may be a peripheral circuit region where peripheral circuits are provided. The substrate 100 may be, for example, a semiconductor substrate including silicon, silicon on insulator (SOI), silicon-germanium (SiGe), germanium (Ge), gallium-arsenic (GaAs), etc.

Memory transistors TR1 may be provided on the first region RG1 of the substrate 100, and a peripheral transistor TR2 may be provided on the second region RG2 of the substrate 100. The substrate 100 may be provided thereon with a first interlayer dielectric layer 102 that may extend on and/or, in some embodiments, may cover, the memory transistors TR1 and the peripheral transistor TR2. For example, the first interlayer dielectric layer 102 may include silicon oxide, silicon nitride, and/or silicon oxynitride.

Line structures 110 may be provided in the first interlayer dielectric layer 102. Each of the line structures 110 may include an electrical line 104 on an upper portion of the first interlayer dielectric layer 102 and a contact 106 between the substrate 100 and the electrical line 104. The contact 106 on the first region RG1 may electrically connect the electrical line 104 and the memory transistor TR1 to each other. The contact 106 on the second region RG2 may electrically connect the electrical line 104 and the peripheral transistor TR2 to each other. Although not shown, the line structures 110 may include a plurality of electrical wiring layers that are vertically stacked. The line structures 110 may include a metallic material, for example, copper (Cu).

The first interlayer dielectric layer 102 may be provided thereon with an intermediate layer 112 and a second interlayer dielectric layer 114. The intermediate layer 112 may interpose between the first interlayer dielectric layer 102 and the second interlayer dielectric layer 114. For example, the second interlayer dielectric layer 114 may include silicon oxide, silicon nitride, and/or silicon oxynitride. The intermediate layer 112 may include, for example, carbon-containing silicon nitride.

The first region RG1 of the substrate 100 may be provided thereon with cell contact plugs 116 that penetrate the second interlayer dielectric layer 114 and the intermediate layer 112 to come into connection with the line structures 110. Each of the cell contact plugs 116 may be in contact with the electrical line 104 of the line structure 110. For example, the cell contact plugs 116 may include one or more of doped semiconductor (e.g., doped silicon), metal (e.g., tungsten, titanium, or tantalum), conductive metal nitride (e.g., titanium nitride, tantalum nitride, or tungsten nitride), and metal-semiconductor compound (e.g., metal silicide).

Data storage structures DSS may be provided on the second interlayer dielectric layer 114 on the first region RG1. When viewed in plan, the data storage structures DSS may be two-dimensionally arranged along a first direction D1 and a second direction D2 intersecting the first direction D1, as illustrated in FIG. 1. Both the first direction D1 and the second direction D2 may be horizontal directions that extend parallel to a surface (e.g., a top surface) the substrate 100 and may perpendicular to the third direction D3 (e.g., a vertical direction). The data storage structures DSS may be correspondingly coupled to the cell contact plugs 116.

Each of the data storage structures DSS may include a data storage part 130, a bottom electrode 120 between the cell contact plug 116 and the data storage part 130, and a top electrode 140 spaced apart from the bottom electrode 120 across the data storage part 130. The bottom electrode 120 may be in direct contact with a top surface of the cell contact plug 116. The bottom and top electrodes 120 and 140 may include a conductive material. For example, the bottom and top electrodes 120 and 140 may include conductive metal nitride (e.g., titanium nitride or tantalum nitride). The data storage part 130 will be further discussed in detail below.

Recess regions RS may be in an upper portion of the second interlayer dielectric layer 114 on the first region RG1. Each of the recess regions RS may lie between the data storage structures DSS adjacent to each other. For example, when viewed in plan, the recess regions RS may not overlap the data storage structures DSS.

Referring to FIGS. 2 and 3, the second interlayer dielectric layer 114 may have a first top surface TS1 on the first region RG1 and a second top surface TS2 on the second region RG2. The second top surface TS2 may be located at a level different from that of the first top surface TS1. For example, the second top surface TS2 may be higher than the first top surface TS1. The second interlayer dielectric layer 114 may have a sidewall SW1 connecting the first top surface TS1 and the second top surface TS2 to each other. The sidewall SW1 of the second interlayer dielectric layer 114 may be between the first region RG1 and the second region RG2. In some embodiments, the sidewall SW1 of the second interlayer dielectric layer 114 may be adjacent to an interface between the first region RG1 and the second region RG2, as illustrated in FIGS. 2 and 3. The sidewall SW1 may have an angle θ with respect to a top surface of the substrate 100 of about 35 degrees to about 90 degrees. When the angle θ between the sidewall SW1 and the top surface of the substrate 100 approaches 90 degrees, the second interlayer dielectric layer 114 may have a stepwise profile (e.g., a stepped shape) between the first and second regions RG1 and RG2. The second interlayer dielectric layer 114 may have a third top surface, which is in contact with a bottom surface of each of the data storage structures DSS, higher than the first top surface TS1. The third top surface of the second interlayer dielectric layer 114 may also be higher than the second top surface TS2.

A capping layer 150 may be provided on and/or, in some embodiments, may cover, the second interlayer dielectric layer 114 and the data storage structures DSS. The capping layer 150 may extend on, in some embodiments, may cover, the top surface of the second interlayer dielectric layer 114 and sidewalls of the data storage structures DSS. For example, the capping layer 150 may include silicon nitride.

A third interlayer dielectric layer 118 may be provided on the capping layer 150. For example, the third interlayer dielectric layer 118 may include silicon oxide, silicon nitride, or silicon oxynitride.

First conductive lines MI1 may be provided in the third interlayer dielectric layer 118 on the first region RG1. The first conductive lines MI1 may be arranged along the first direction D1. The first conductive lines MI1 may extend in parallel along the second direction D2. In some embodiments, the first conductive lines MI1 may be spaced apart from each other in the first direction D1, as illustrated in FIG. 1. Each of the first conductive lines MI1 may be electrically connected to the data storage structures DSS arranged along the second direction D2. The first conductive line MI1 may be in contact with the top electrodes 140 of the data storage structures DSS. The first conductive lines MI1 may serve as bit lines included in a data storage device.

Second conductive lines MI2 may be provided in the third interlayer dielectric layer 118 on the second region RG2. The second conductive lines MI2 may be arranged along the first direction D1. The second conductive lines MI2 may extend in parallel along the second direction D2. In some embodiments, the second conductive lines MI2 may be spaced apart from each other in the first direction D1, as illustrated in FIG. 1. In some embodiments, each of the second conductive lines MI2 may have a width (e.g., a width in the first direction D1) greater than that of each of the first conductive lines MI1. Each of the second conductive lines MI2 may include a contact part CP. The contact part CP of the second conductive line MI2 may penetrate the third interlayer dielectric layer 118, the capping layer 150, the second interlayer dielectric layer 114, and the intermediate layer 112 to come into contact with the line structure 110 on the second region RG2.

Each of the first and second conductive lines MI1 and MI2 may include a conductive pattern 160 and a barrier pattern 162. The barrier pattern 162 may extend on, in some embodiments, may cover, sidewalls and a bottom surface of the conductive pattern 160. The barrier pattern 162 may not cover a top surface of the conductive pattern 160. The conductive pattern 160 may include a metallic material, for example, copper (Cu), and the barrier pattern 162 may include conductive metal nitride.

The data storage structures DSS will be hereinafter discussed in detail with reference to FIGS. 4A and 4B. Referring to FIG. 4A, the data storage part 130 of the data storage structure DSS may include a reference layer ML1, a free layer ML2, and a tunnel barrier TBL between the reference layer ML1 and the free layer ML2. The reference layer ML1 may have a magnetization direction MD1 fixed in one direction, and the free layer ML2 may have a magnetization direction MD2 that can be changed parallel or antiparallel to the magnetization direction MD1 of the reference layer ML1. The magnetization directions MD1 and MD2 of the reference and free layers ML1 and ML2 may be parallel to an interface between the tunnel barrier TBL and the free layer ML2. FIG. 4A shows an example in which the free layer ML2 is between the tunnel barrier TBL and the top electrode 140, but the present inventive concepts are not limited thereto. Unlike that shown in FIG. 4A, the free layer ML2 may be between the tunnel barrier TBL and the bottom electrode 120. The reference layer ML1, the tunnel barrier TBL, and the free layer ML2 may constitute a magnetic tunnel junction. When the magnetization directions of the reference and free layers ML1 and ML2 are parallel to the interface, each of the reference and free layers ML1 and ML2 may include a ferromagnetic material. The reference layer ML1 may further include an anti-ferromagnetic material that fixes a magnetization direction of the ferromagnetic material.

Referring to FIG. 4B, the data storage part 130 may include a reference layer ML1, a free layer ML2, and a tunnel barrier TBL between the reference layer ML1 and the free layer ML2. The reference layer ML1 may have a magnetization direction MD1 fixed in one direction, and the free layer ML2 may have a magnetization direction MD2 that can be changed parallel or antiparallel to the magnetization direction MD1 of the reference layer ML1. The magnetization directions MD1 and MD2 of the reference and free layers ML1 and ML2 may be perpendicular to an interface between the tunnel barrier TBL and the free layer ML2. FIG. 4B shows an example in which the free layer ML2 is between the tunnel barrier TBL and the top electrode 140, but the present inventive concepts are not limited thereto. Unlike that shown in FIG. 4B, the free layer ML2 may be between the tunnel barrier TBL and the bottom electrode 120. The reference layer ML1, the tunnel barrier TBL, and the free layer ML2 may constitute a magnetic tunnel junction. When the magnetization directions of the reference and free layers ML1 and ML2 are perpendicular to the interface, each of the reference and free layers ML1 and ML2 may include one or more of a perpendicular magnetization material (e.g., CoFeTb, CoFeGd, CoFeDy), a perpendicular magnetization material having an $L_{10}$ structure, CoPt of a hexagonal close packed lattice structure, and a perpendicular magnetization structure. The perpendicular magnetization material having the $L_{10}$ structure may include one or more of FePt of the $L_{10}$ structure, FePd of the $L_{10}$ structure, CoPd of the $L_{10}$ structure, and CoPt of the $L_{10}$ structure. The perpendicular magnetization structure may include magnetic layers and non-magnetic layers that are alternately and repeatedly stacked. For example, the perpendicular magnetization structure may include one or more of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n, and n is the number of stacking.

Referring to FIG. 5, a unit memory cell MC may include the data storage part 130 and its corresponding select element SE. The data storage part 130 and the select element SE may be electrically connected in series. The data storage part 130 may be connected between the select element SE and a bit line BL. The select element SE may be connected between the data storage part 130 and a source line SL and may be controlled by a word line WL. For example, the select element SE may be the memory transistor TR1 discussed with reference to FIGS. 1 to 3.

The data storage part 130 may include a magnetic tunnel junction MTJ, which include magnetic layers ML1 and ML2 spaced apart from each other and a tunnel barrier layer TBL between the magnetic layers ML1 and ML2. One of the magnetic layers ML1 and ML2 may be a reference layer having a magnetization direction that is fixed regardless of an external magnetic field under a normal use environment. The other of the magnetic layers ML1 and ML2 may be a free layer whose magnetization direction is freely changed by the external magnetic field.

The magnetic tunnel junction MTJ may have an electrical resistance whose value is much greater when the magnetization directions of the reference and free layers are anti-parallel to each other relative to when the magnetization directions of the reference and free layers are parallel to each other. For example, the electrical resistance of the magnetic tunnel junction MTJ may be controlled by changing the magnetization direction of the free layer. Accordingly, the data storage part 130 may store data in the unit memory cell MC using difference in electrical resistance caused by the magnetization direction.

FIGS. 6 to 11 are cross-sectional views taken along line the A-A' of FIG. 1 illustrating a method of manufacturing a data storage device according to some embodiments of the present inventive concepts.

Figure 6:
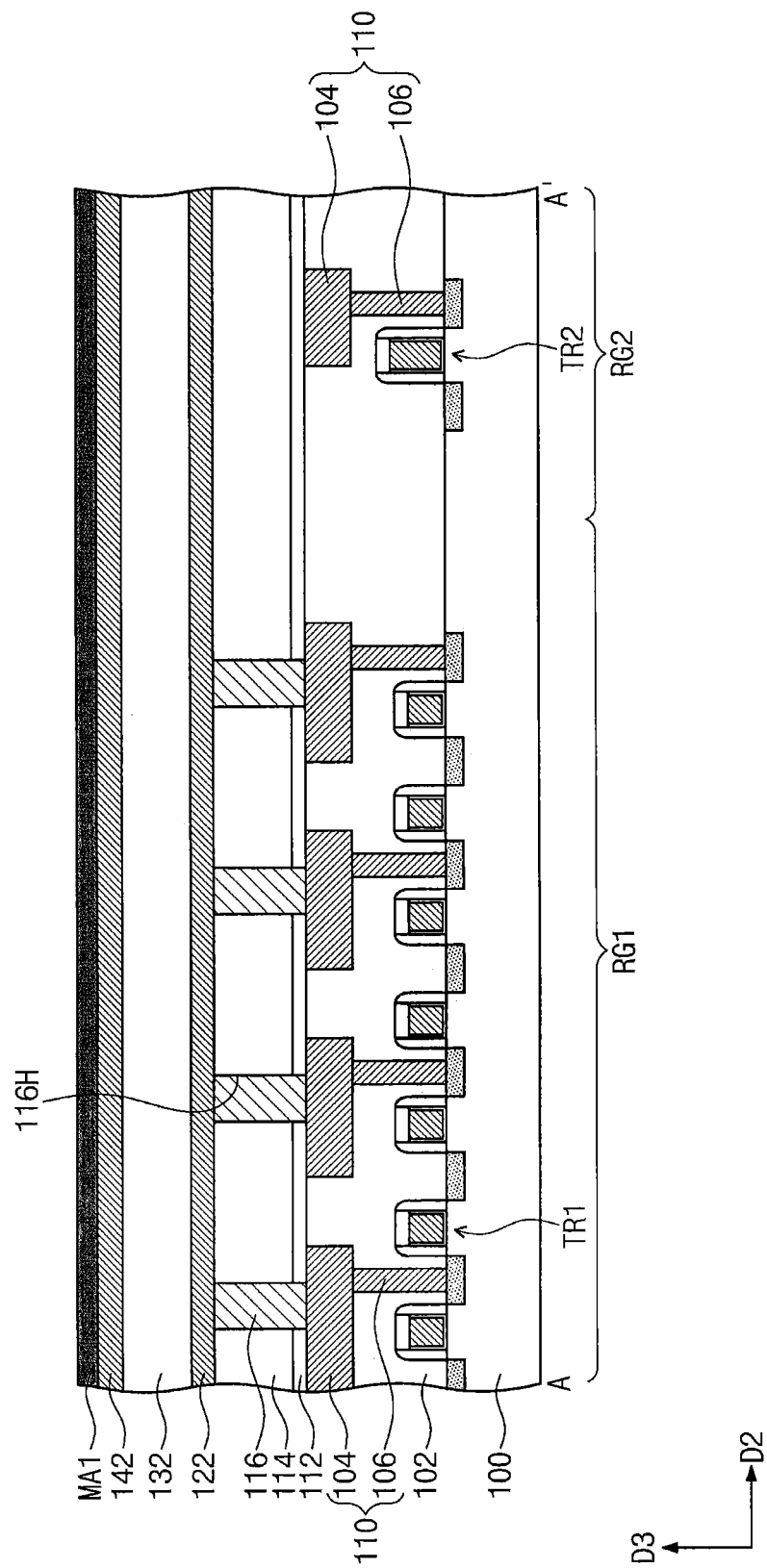
FIGS. 6 to 11 illustrate cross-sectional views taken along line A-A' of FIG. 1, showing a method of manufacturing a data storage device according to some embodiments of the present inventive concepts.

Referring to FIGS. 1 and 6, memory transistors TR1 may be formed on a first region RG1 of a substrate 100, and a peripheral transistor TR2 may be formed on a second region RG2 of the substrate 100. A first interlayer dielectric layer 102 may be formed on the substrate 100 and, in some embodiments, may cover the memory transistors TR1 and the peripheral transistor TR2. Line structures 110 may be formed on the substrate 100 to come into connection with the memory transistors TR1 and the peripheral transistor TR2. For example, the line structures 110 may be formed of copper (Cu). The first interlayer dielectric layer 102 may be formed using silicon oxide, silicon nitride, and/or silicon oxynitride.

An intermediate layer 112 and a second interlayer dielectric layer 114 may be sequentially formed on the first interlayer dielectric layer 102. The second interlayer dielectric layer 114 may be formed using silicon oxide, silicon nitride, and/or silicon oxynitride, and the intermediate layer 112 may be formed of carbon-containing silicon nitride.

On the first region RG1 of the substrate 100, cell contact plugs 116 may be formed to penetrate the second interlayer dielectric layer 114 and the intermediate layer 112 to come into connection with the line structures 110. The formation of the cell contact plugs 116 may include forming cell contact holes 116H to penetrate the second interlayer dielectric layer 114 and the intermediate layer 112, and forming the cell contact plugs 116 in corresponding cell contact holes 116H. The cell contact plugs 116 may include one or more of doped semiconductor, metal, conductive metal nitride, and metal-semiconductor compound.

A bottom electrode layer 122, a data storage layer 132, a first top electrode layer 142, and a first mask layer MA1 may be sequentially formed on the second interlayer dielectric layer 114. The bottom electrode layer 122 and the first top electrode layer 142 may be formed using, for example, conductive metal nitride. The data storage layer 132 may include stacked magnetic layers. The first mask layer MA1 may be formed using, for example, silicon nitride.

Figure 7:
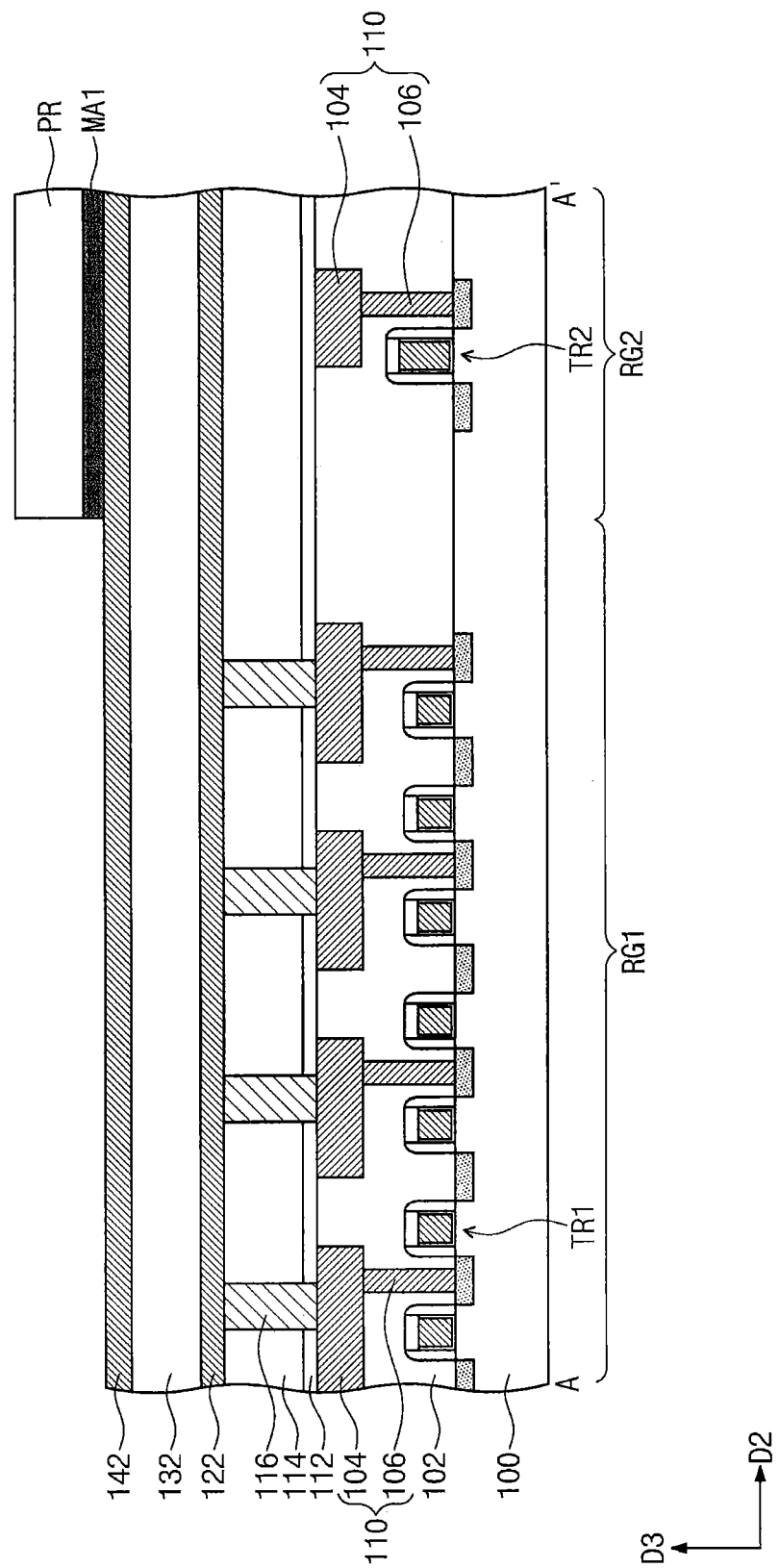

Referring to FIGS. 1 and 7, a photoresist pattern PR may be formed on the second region RG2. The photoresist pattern PR may selectively reveal the first region RG1. The photoresist pattern PR may be formed on the second region RG2 and may not be formed on the first region RG1. The photoresist pattern PR may be used as a mask to selectively remove the first mask layer MA1 on the first region RG1. The first mask layer MA1 may then remain on the second region RG2. The first mask layer MA1 may expose the first top electrode layer 142 formed on the first region RG1.

Figure 8:
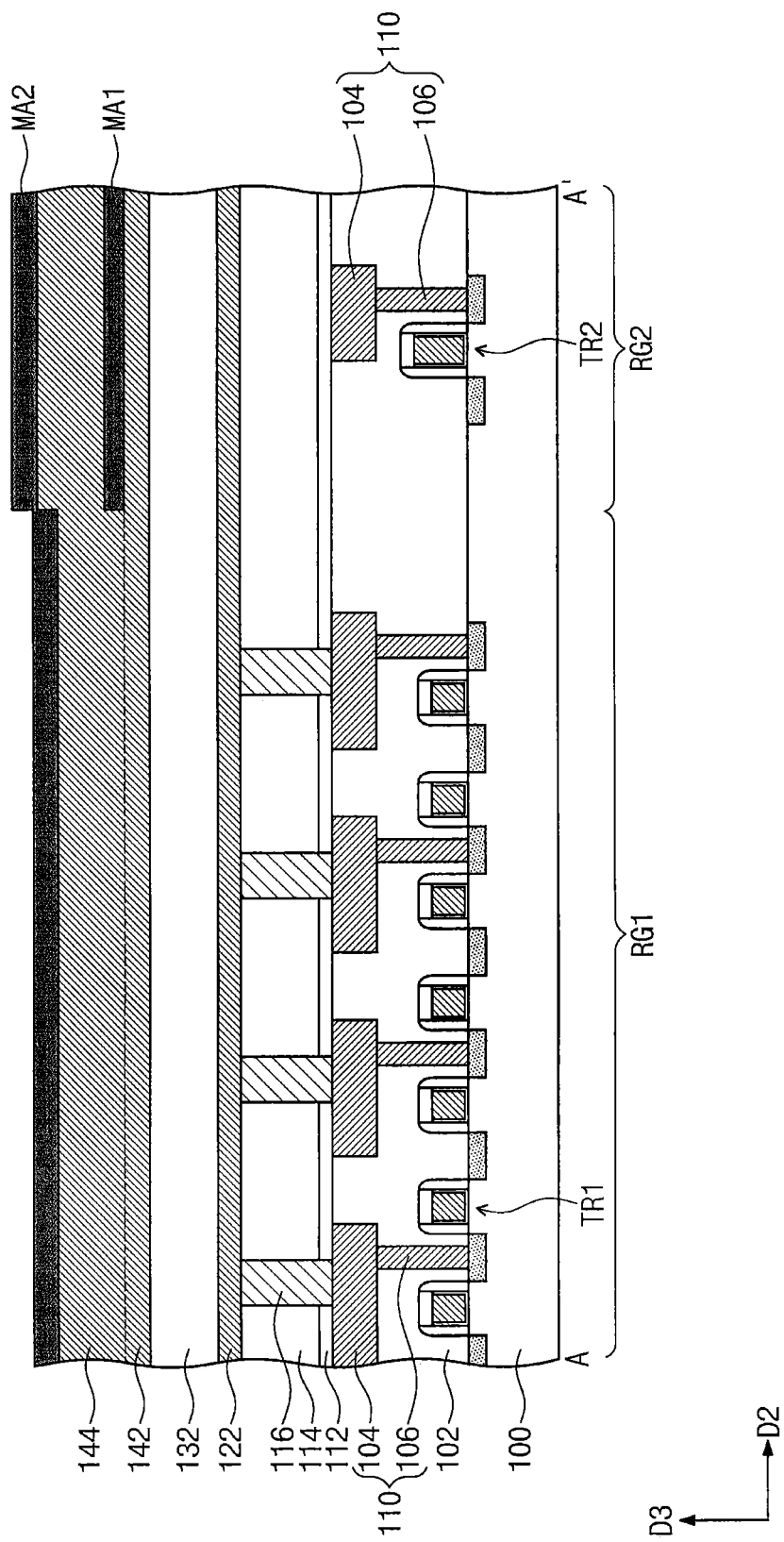

Referring to FIGS. 1 and 8, a second top electrode layer 144 may be formed on the first top electrode layer 142 of the first region RG1 and on the first mask layer MA1 of the second region RG2. In some embodiments, the second top electrode layer 144 may be formed using the same material as that of the first top electrode layer 142. A second mask layer MA2 may be formed on the second top electrode layer 144. The second mask layer MA2 may be formed using, for example, silicon nitride.

Figure 9:
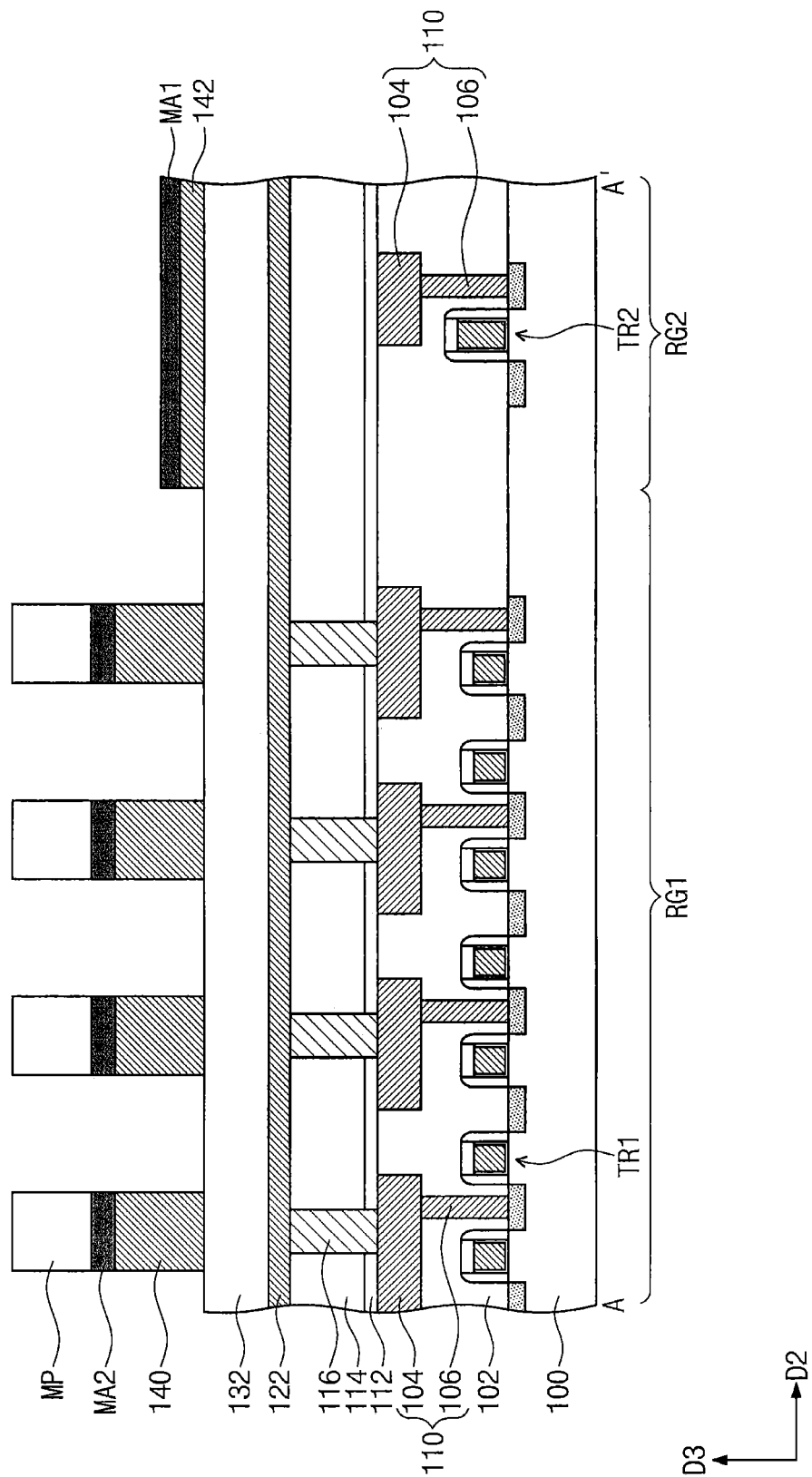

Referring to FIGS. 1 and 9, mask patterns MP may be formed on the second mask layer MA2 of the first region RG1. The mask patterns MP may define areas where the data storage structures DSS of FIG. 1 are formed. For example, the mask patterns MP may be formed using a silicon oxide layer.

A patterning process may be performed on the second mask layer MA2 and the first and second top electrode layers 142 and 144 using the mask patterns MP as an etch mask to form top electrodes 140 on the first region RG1. Portions of the second mask layer MA2 may remain between the top electrodes 140 and the mask patterns MP. A top surface of the data storage layer 132 may be exposed between the top electrodes 140.

When the patterning process is performed (e.g., while the patterning process is being performed), the second mask layer MA2 and the second top electrode layer 144 formed on the second region RG2 may also be etched. The first mask layer MA1 may be between the first and second top electrode layers 142 and 144 on the second region RG2. When the second top electrode layer 144 is etched (e.g., while etching the second top electrode layer 144), the first mask layer MA1 remaining on the second region RG2 may serve as an etch stop layer. As such, after the patterning process, the first mask layer MA1 and the first top electrode layer 142 may remain on the second region RG2. In other words, after the patterning process, the first mask layer MA1 formed on the second region RG2 may be exposed. Accordingly, the first mask layer MA1 and the first top electrode layer 142 may cause the data storage layer 132 formed on the second region RG2 to have a non-exposed top surface. In some embodiments, the patterning process may not completely remove the first mask layer MA1 formed on the second region RG2, and thus the data storage layer 132 formed on the second region RG2 may not be exposed after the patterning process.

Figure 10:
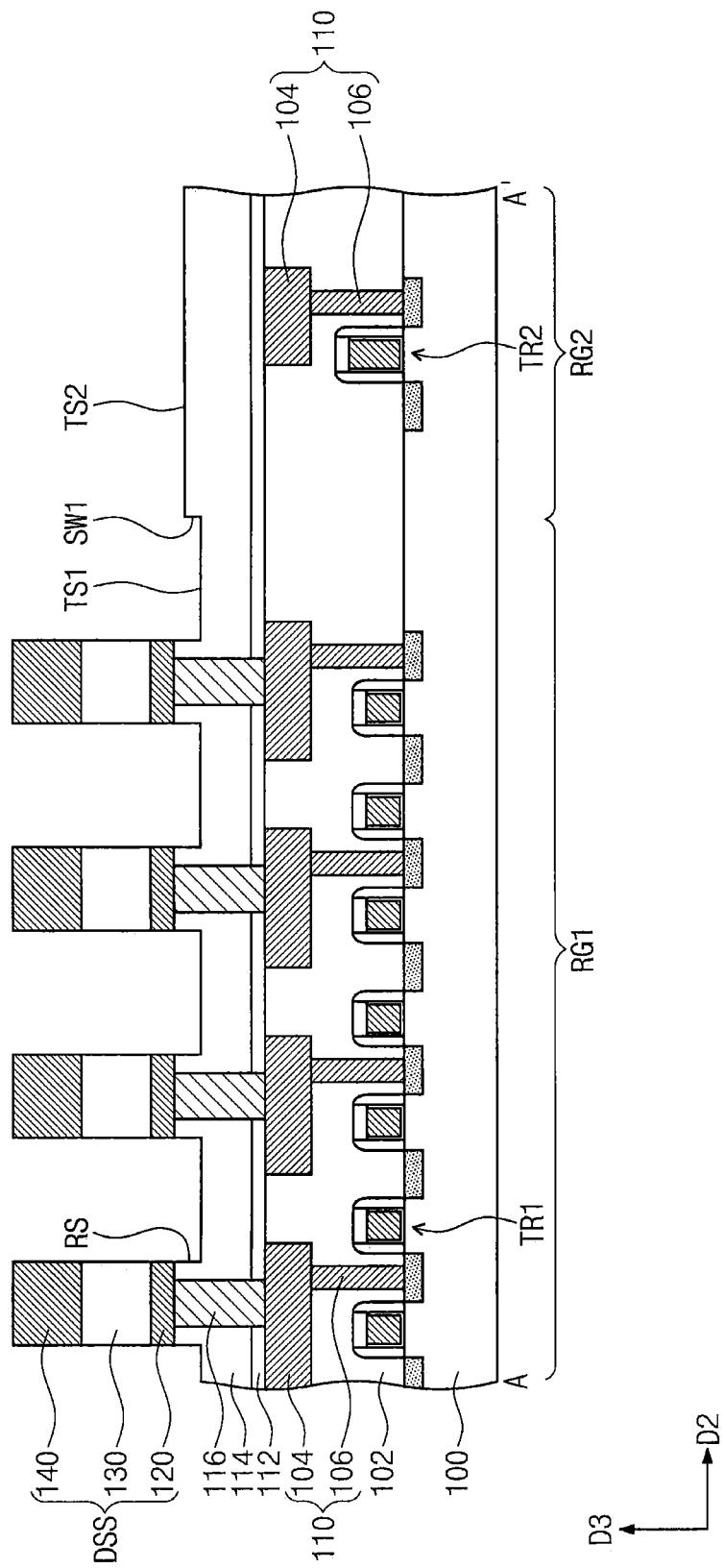

Referring to FIGS. 1 and 10, an etching process may be performed to etch the data storage layer 132 and the bottom electrode layer 122 using the mask patterns MP, the second mask layer MA2, and the top electrodes 140 on the first region RG1 as an etch mask, which may form data storage parts 130 and bottom electrodes 120. A data storage structure DSS may include the bottom electrode 120, the data storage part 130, and the top electrode 140 that are formed on the first region RG1. It will be understood that the data storage parts 130 may refer to data storage elements.

The etching process may employ a physical etching process, for example, an ion beam etching process. In some embodiments, while the etching process is being performed, the mask patterns MP and the second mask layer MA2 may be completely removed from the first region RG1, as illustrated in FIG. 10. During the etching process, the second interlayer dielectric layer 114 may be over-etched on its upper portion exposed between the top electrodes 140. Therefore, recess regions RS may be formed between the data storage structures DSS.

In some embodiments, while the etching process is being performed, the first mask layer MA1 and the first top electrode layer 142 may be completely removed from the second region RG2, as illustrated in FIG. 10. During the etching process, the second interlayer dielectric layer 114 may be etched on its upper portion on the second region RG2. The upper portion of the second interlayer dielectric layer 114 on the second region RG2 may be etched after the first mask layer MA1 and the first top electrode layer 142 are all removed. The first mask layer MA1 and the first top electrode layer 142 may serve as etching protection layers, such that the second interlayer dielectric layer 114 on the second region RG2 may be less etched than the second interlayer dielectric layer 114 on the first region RG1.

A second top surface TS2 of the second interlayer dielectric layer 114 on the second region RG2 may be higher than a first top surface TS1 of the second interlayer dielectric layer 114 on the first region RG1. A distance between the second top surface TS2 of the second interlayer dielectric layer 114 and the substrate 100 (e.g., a top surface of the substrate 100) may be greater than a distance between the first top surface TS1 of the second interlayer dielectric layer 114 and the substrate 100 (e.g., a top surface of the substrate 100). The first mask layer MA1 and the first top electrode layer 142 on the second region RG2 may cause the second interlayer dielectric layer 114 to have a stepwise profile between the first region RG1 and the second region RG2. For example, a sidewall SW1 connecting the first and second top surfaces TS1 and TS2 to each other may meet a top surface of the substrate 100 at an angle of about 35 degrees to about 90 degrees. The sidewall SW1 may have an angle of about 35 degrees to about 90 degrees with respect to the top surface of the substrate 100. The second interlayer dielectric layer 114 may have a third top surface in contact with a bottom surface of each of the data storage structures DSS, and the third top surface of the second interlayer dielectric layer 114 may be higher than the first surface TS1. The third top surface of the second interlayer dielectric layer 114 may also be higher than the second top surface TS2. A distance between the third top surface of the second interlayer dielectric layer 114 and the top surface of the substrate 100 may be greater than the distance between the second top surface TS2 of the second interlayer dielectric layer 114 and the top surface of the substrate 100.

Figure 11:
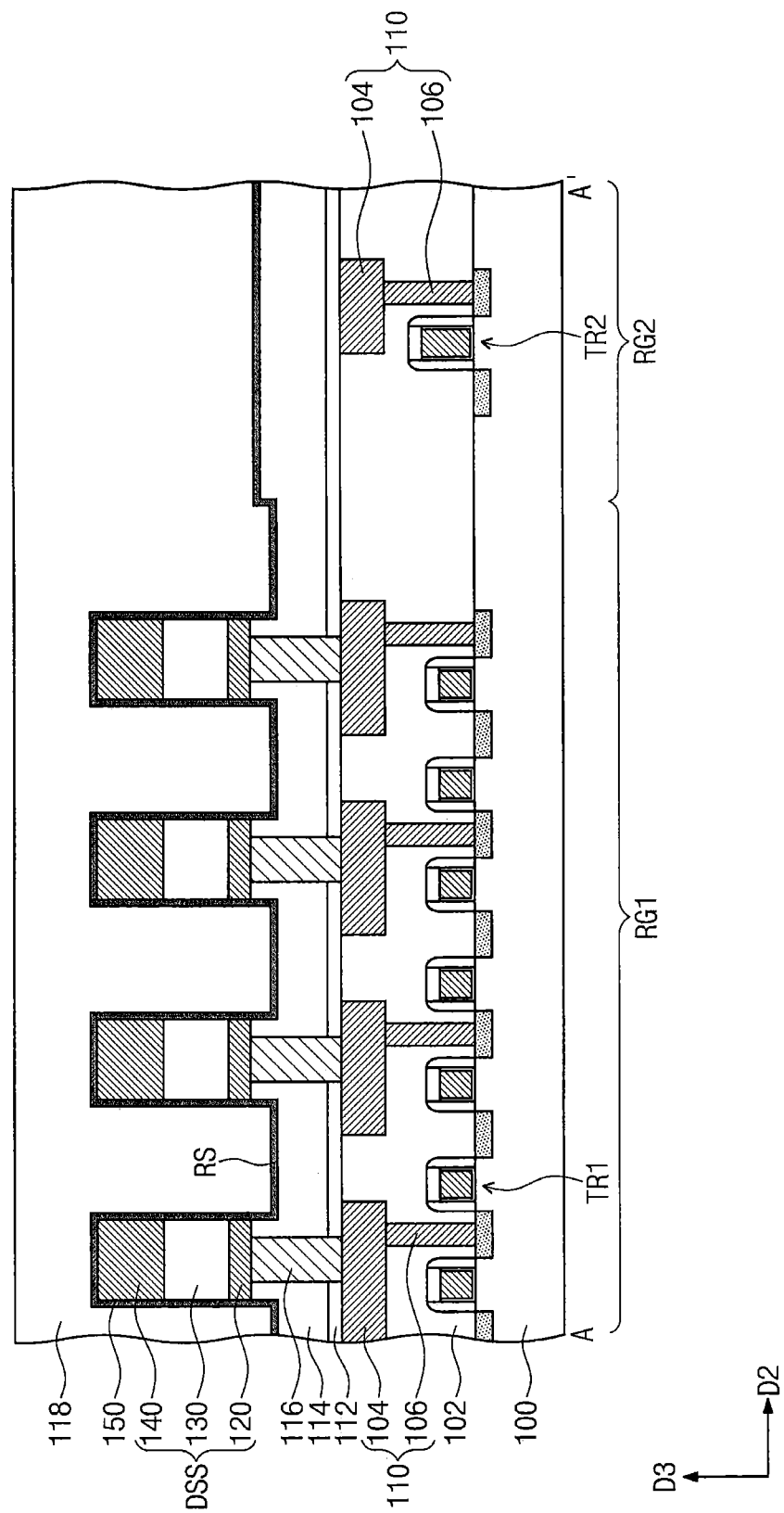

Referring to FIGS. 1 and 11, a capping layer 150 may be conformally formed on the data storage structures DSS and the second interlayer layer dielectric layer 114. For example, the capping layer 150 may be formed using silicon nitride. A third interlayer dielectric layer 118 may be formed on the capping layer 150. For example, the third interlayer dielectric layer 118 may be formed using silicon oxide, silicon nitride, and/or silicon oxynitride.

Referring back to FIGS. 1 and 2, first conductive lines MI1 and second conductive lines MI2 may be respectively formed on the third interlayer dielectric layer 118 of the first region RG1 and the second region RG2.

The formation of the first conductive lines MI1 may include etching the third interlayer dielectric layer 118 and the capping layer 150 to form first wiring holes exposing the top electrodes 140 of the data storage structures DSS, and sequentially forming a barrier layer and a conductive layer in the first wiring holes.

The formation of the second conductive lines MI2 may include forming contact holes to penetrate the third interlayer dielectric layer 118, the capping layer 150, the second interlayer dielectric layer 114, and the intermediate layer 112, etching an upper portion of the third interlayer dielectric layer 118 to form second wiring holes, and sequentially forming a barrier layer and a conductive layer in the contact holes and the second wiring holes.

As appreciated by the present inventors, if the first mask layer MA1 and the first top electrode layer 142 do not remain on the second region RG2 as illustrated in FIG. 9, when an etching process is performed (e.g., while an etching process is being performed) to form the data storage structures DSS as illustrated in FIG. 10, the second interlayer dielectric layer 114 on the second region RG2 may be more deeply etched than the second interlayer dielectric layer 114 on the first region RG1. For example, a relatively large difference in heights may be produced between the first top surface TS1 of the second interlayer dielectric layer 114 on the first region RG1 and the second top surface TS2 of the second interlayer dielectric layer 114 on the second region RG2.

According to some embodiments of the present inventive concepts, before an etching process is performed to form the data storage structures DSS, the first mask layer MA1 and the first top electrode layer 142 may remain on the second region RG2 as illustrated in FIG. 9. Accordingly, the second interlayer dielectric layer 114 of the second region RG2 may be minimally etched during the etching process. While the etching process is being performed, the first mask layer MA1 and the first top electrode layer 142 on the second region RG2 may cover the second interlayer dielectric layer 114 on the second region RG2 until the first mask layer MA1 and the first top electrode layer 142 on the second region RG2 are completely etched, and thus only a portion of the second interlayer dielectric layer 114 of the second region RG2 may be etched. For example, a difference in heights may be reduced between the first top surface TS1 of the second interlayer dielectric layer 114 on the first region RG1 and the second top surface TS2 of the second interlayer dielectric layer 114 on the second region RG2. When the height difference is reduced between the second interlayer dielectric layer 114 of the first region RG1 and the second interlayer dielectric layer 114 of the second region RG2, process defects may be reduced or possibly prevented from occurring in subsequent processes.

Figure 12:
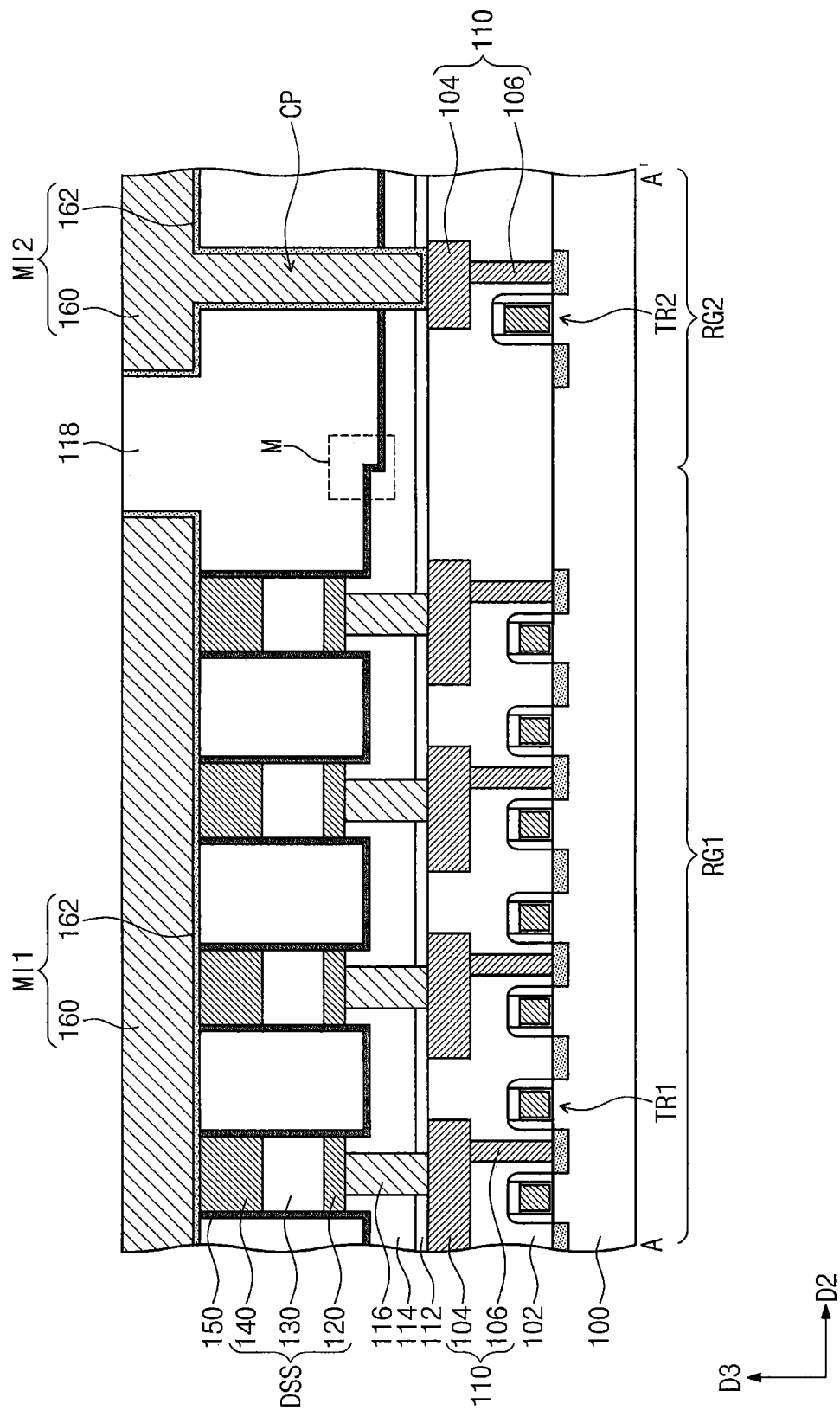
FIG. 12 illustrates a cross-sectional view, taken along the line A-A' of FIG. 1, of a data storage device according to some embodiments of the present inventive concepts.
Figure 13:
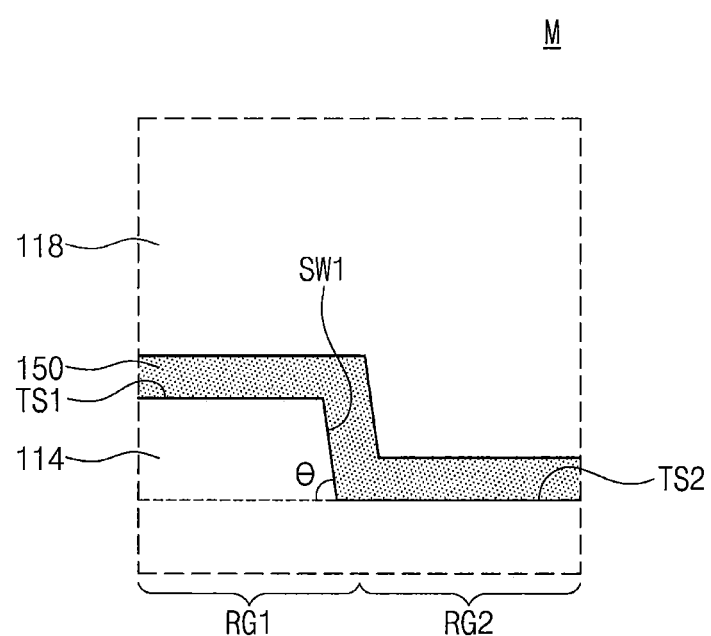
FIG. 13 illustrates an enlarged cross-sectional view of the section M of FIG. 12.

FIG. 12 illustrates a cross-sectional view, taken along the line A-A' of FIG. 1, of a data storage device according to some embodiments of the present inventive concepts. FIG. 13 illustrates an enlarged cross-sectional view of the section M of FIG. 12. In embodiments that follow, a detailed description of technical features repetitive to those discussed above with reference to FIGS. 1 to 3 will be omitted and differences will be explained in detail.

Referring to FIGS. 1, 12, and 13, the first top surface TS1 of the second interlayer dielectric layer 114 on the first region RG1 may be higher than the second top surface TS2 of the second interlayer dielectric layer 114 on the second region RG2. The sidewall SW1 connecting the first and second top surfaces TS1 and TS2 to each other may meet the top surface of the substrate 100 at an angle of about 35 degrees to about 90 degrees. The sidewall SW1 may have an angle of about 35 degrees to about 90 degrees with respect to the top surface of the substrate 100. The second interlayer dielectric layer 114 may have the stepwise profile between the first region RG1 and the second region RG2.

In data storage devices and methods of manufacturing the same according to inventive concepts, a difference in heights of the interlayer dielectric layer between the cell region and the peripheral circuit region may be small. Thus, process defects may be reduced or possibly prevented from being produced in subsequent processes. As a result, data storage devices according to inventive concepts may have excellent reliability.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a data storage device, the method comprising:

providing a substrate including a cell region and a peripheral circuit region;

forming a data storage layer on the cell region and the peripheral circuit region of the substrate;

selectively forming a mask layer on a portion of the data storage layer that is formed on the peripheral circuit region;

forming a top electrode layer on the data storage layer and the mask layer;

patterning the top electrode layer to form a plurality of top electrodes on the cell region; and patterning the data storage layer using the plurality of top electrodes as an etch mask to form a plurality of data storage parts on the cell region, wherein, while patterning the top electrode layer, the mask layer on the peripheral circuit region serves as an etch stop layer.

2. The method of claim 1, further comprising forming an interlayer dielectric layer between the substrate and the data storage layer, wherein patterning the data storage layer comprises etching an upper portion of the interlayer dielectric layer, and wherein a top surface of a first portion of the interlayer dielectric layer that is formed on the cell region is located at a level different from that of a top surface of a second portion of the interlayer dielectric layer that is formed on the peripheral circuit region after patterning the data storage layer.

3. The method of claim 2, wherein, while patterning the data storage layer, the mask layer on the peripheral circuit region protects the interlayer dielectric layer beneath the mask layer.

4. The method of claim 1, further comprising forming a bottom electrode layer between the substrate and the data storage layer, wherein patterning the data storage layer using the plurality of top electrodes as an etch mask comprises patterning the bottom electrode layer to form a plurality of bottom electrodes.

5. The method of claim 1, wherein patterning the data storage layer comprises performing an ion beam etching process.

6. The method of claim 5, wherein, when the ion beam etching process is performed, the mask layer is removed from the peripheral circuit region.

7. The method of claim 1, wherein the data storage layer comprises:

a fixed layer having a fixed magnetization direction;
a free layer having a variable magnetization direction; and
a tunnel barrier between the fixed layer and the free layer.

8. A method of manufacturing a data storage device, the method comprising:

providing a substrate including a first region and a second region;

forming a first interlayer dielectric layer on the first region and the second region of the substrate;

forming a data storage layer on the first interlayer dielectric layer;

selectively forming a mask layer on a portion of the data storage layer that is formed on the second region;

forming a top electrode layer on the data storage layer and the mask layer;

patterning the top electrode layer to form a plurality of top electrodes on the first region; and patterning the data storage layer using the plurality of top electrodes as an etch mask to form a plurality of data storage parts on the first region, wherein, during patterning the data storage layer, an upper portion of the first interlayer dielectric layer is etched such that a first portion of the first interlayer dielectric layer that is formed on the first region has a top surface at a different level from that of a top surface of a second portion of the first interlayer dielectric layer that is formed on the second region.

9. The method of claim 8, wherein patterning the top electrode layer comprises exposing the mask layer on the second region.

10. The method of claim 8, wherein the first interlayer dielectric layer has a sidewall connecting the top surface of the first portion of the first interlayer dielectric layer that is formed on the first region to the top surface of the second portion of the first interlayer dielectric layer that is formed on the second region, and wherein the sidewall has an angle with respect to a top surface of the substrate of about 35 degrees to about 90 degrees.

11. The method of claim 8, further comprising forming a bottom electrode layer between the first interlayer dielectric layer and the data storage layer, wherein patterning the data storage layer using the plurality of top electrodes as an etch mask comprises patterning the bottom electrode layer to form a plurality of bottom electrodes.

12. The method of claim 8, further comprising:

forming a memory transistor on the first region of the substrate;

forming a peripheral transistor on the second region of the substrate; and forming a cell contact plug that penetrates the first interlayer dielectric layer to electrically connect with the memory transistor, wherein the data storage layer is formed on the cell contact plug.

13. The method of claim 8, wherein, during patterning the data storage layer, the upper portion of the first interlayer dielectric layer is etched to form a recess in the first interlayer dielectric layer between two adjacent ones of the plurality of data storage parts.

14. A method of manufacturing a data storage device, the method comprising:

forming a data storage layer extending on a first region and a second region of a substrate;

forming a mask layer on a first portion of the data storage layer that is formed on the second region of the substrate;

forming a top electrode layer on the data storage layer and the mask layer;

forming a plurality of mask patterns on the top electrode layer on the first region of the substrate;

forming a plurality of top electrodes on the first region by etching the top electrode layer using the plurality of mask patterns as an etch mask until a second portion of the data storage layer that is formed on the first region and the mask layer that is formed on the second region are exposed; and forming a plurality of data storage elements on the first region by etching the data storage layer using the plurality of top electrodes as an etch mask.

15. The method of claim 14, wherein forming the mask layer on the first portion of the data storage layer that is formed on the second region of the substrate comprises:

forming a preliminary mask layer on the first region and the second region of the substrate; and removing a portion of the preliminary mask layer that is formed on the first region of the substrate.

16. The method of claim 14, further comprising forming a first top electrode layer extending on the first region and the second region of the substrate before forming the mask layer, wherein the first top electrode layer extends between the data storage layer and the mask layer, wherein forming the top electrode layer on the data storage layer and the mask layer comprises forming a second top electrode layer contacting an upper surface of the first top electrode layer formed on the first region of the substrate and contacting an upper surface of the mask layer formed on the second region of the substrate, and wherein forming the plurality of top electrodes comprises sequentially etching the second top electrode layer and the first top electrode layer using the plurality of mask patterns as an etch mask until the second portion of the data storage layer that is formed on the first region and the mask layer that is formed on the second region are exposed.

17. The method of claim 16, wherein a portion of the first top electrode layer is between the data storage layer and the mask layer after forming the plurality of top electrodes.

18. The method of claim 14, further comprising:

sequentially forming an interlayer dielectric layer and a bottom electrode layer on the substrate before forming the data storage layer; and forming a plurality of bottom electrodes on the first region by etching the bottom electrode layer using the plurality of top electrodes as an etch mask after forming the plurality of data storage elements, wherein an upper surface of a portion of the interlayer dielectric layer that is adjacent an interface between the first region and the second region has a stepped shape.

19. The method of claim 18, wherein a side of the stepped shape of the interlayer dielectric layer has an angle of about 35 degrees to about 90 degrees with respect to an upper surface of the substrate.

20. The method of claim 18, wherein the portion of the interlayer dielectric layer has a first top surface on the first region of the substrate and a second top surface on the second region of the substrate, and the second top surface is higher than the first top surface.

* * * * *